(12) United States Patent
Cho

(10) Patent No.: US 8,119,509 B2
(45) Date of Patent: Feb. 21, 2012

(54) METHOD OF MANUFACTURING HIGH-INTEGRATED SEMICONDUCTOR DEVICE AND SEMICONDUCTOR DEVICE MANUFACTURED USING THE SAME

(75) Inventor: Young Man Cho, Icheon-si (KR)

(73) Assignee: Hynix Semiconductor, Inc., Icheon (KR)

( * ) Notice: Subject to any disclaimer, the term of this patent is extended or adjusted under 35 U.S.C. 154(b) by 75 days.

(21) Appl. No.: 12/495,554

(22) Filed: Jun. 30, 2009

(65) Prior Publication Data

US 2010/0025758 A1  Feb. 4, 2010

(30) Foreign Application Priority Data

Jul. 31, 2008  (KR) .................... 10-2008-0075039

(51) Int. Cl.
*H01L 29/78* (2006.01)

(52) U.S. Cl. ........................................ 438/585; 257/329
(58) Field of Classification Search .................. 257/329, 257/E29.262, E21.19; 438/212, 585
See application file for complete search history.

(56) References Cited

U.S. PATENT DOCUMENTS

| 7,531,412 | B2 | 5/2009 | Yoon et al. |
| 2006/0043450 | A1 | 3/2006 | Tang et al. |

FOREIGN PATENT DOCUMENTS

| KR | 1020070009140 A | 1/2007 |
| KR | 1020070038233 A | 4/2007 |
| KR | 100723527 B1 | 5/2007 |

*Primary Examiner* — Steven Loke
*Assistant Examiner* — David Ziskind

(57) ABSTRACT

A semiconductor device comprises a plurality of vertical transistors each comprising barrier metal layers corresponding to source/drain regions in which a conduction region is formed under a channel region having a pillar form, and a bit line comprising a metal layer to connect the plurality of vertical transistors.

5 Claims, 16 Drawing Sheets

METHOD OF MANUFACTURING HIGH-INTEGRATED SEMICONDUCTOR DEVICE AND SEMICONDUCTOR DEVICE MANUFACTURED USING THE SAME

CROSS-REFERENCE TO RELATED APPLICATION

The present application claims priority to Korean patent application number 10-2008-0075039, filed on Jul. 31, 2008, which is incorporated by reference in its entirety.

BACKGROUND OF THE INVENTION

The present invention relates to a method of manufacturing a semiconductor device and, more particularly, to a method of manufacturing a highly integrated semiconductor device (e.g., vertical transistors) and improving the operating characteristic and yield of the semiconductor device.

In general, a semiconductor is a material classified according to its electrical conductivity and belongs to an intermediate region between a conductor and a nonconductor. The semiconductor has a property that is similar to that of the nonconductor in a pure state, but has an increasing electrical conductivity with the addition of impurities or other control. Such a semiconductor is used to produce semiconductor elements, such as transistors, by adding impurities and connecting conductors thereto. A device fabricated using the semiconductor elements and configured to have a variety of functions is called a semiconductor device. A representative example of the semiconductor device may include a semiconductor memory device.

The semiconductor memory device includes a number of unit cells each comprising a capacitor and a transistor. The capacitor is used to temporarily store data. The transistor is used to transfer data between a bit line and the capacitor in response to a control signal (a word line). The transistor is divided into three regions; a gate, a source, and a drain. Electric charges are moved between the source and the drain in response to the control signal input to the gate. The movement of electric charges between the source and the drain is carried out through a channel region.

In the case where a typical transistor is formed in a semiconductor substrate, a gate is formed in the semiconductor substrate, and a source and a drain are formed on both sides of the gate by doping impurities. In this case, a channel region of the transistor is formed between the source and the drain under the gate. The transistor having this horizontal channel region occupies a certain area of the semiconductor substrate. Accordingly, in the case where a complicated semiconductor memory device is fabricated, it is difficult to reduce the area of the semiconductor memory device because of a number of transistors included in the semiconductor memory device.

If the area of the semiconductor memory device is reduced, productivity can be improved because the number of semiconductor memory devices that can be produced per wafer can be increased. Several methods are being proposed in order to reduce the area of the semiconductor memory device. One of the methods is to use a vertical transistor having a vertical channel region instead of a conventional horizontal transistor having a horizontal channel region.

BRIEF SUMMARY OF THE INVENTION

Various embodiments of the invention are directed to providing a method of manufacturing a semiconductor device including vertical transistors, which is capable of improving the operating characteristic and yield of a semiconductor device by forming bit lines using a conductive material and removing alignment error when the bit lines are formed, and a semiconductor device manufactured using the same.

According to an embodiment of the present invention, a semiconductor device comprises a plurality of vertical transistors each comprising barrier metal layers corresponding to source/drain regions in which a conduction region is formed under a channel region having a pillar form, and a bit line comprising a metal layer to connect the plurality of vertical transistors.

Preferably, the barrier metal layers are formed in parallel in a direction of the bit lines under the channel region.

Preferably, the barrier metal layers and the metal layer are made of a same metal material.

Preferably, each of the vertical transistors further comprises the channel region having the pillar form, a gate oxide layer to surround the channel region, and a gate electrode to surround sidewalls of the gate oxide layer.

Preferably, the gate electrode is coupled to a gate electrode of a neighboring vertical transistor by a word line, and the word line is formed over the word line in a direction crossing the bit lines.

According to another embodiment of the present invention, a method of manufacturing a semiconductor memory device comprises forming barrier metal layers on lower sides of each of silicon pillars coupled by a bit line, and forming gate electrodes on sidewalls of each of the silicon pillars, thereby completing a vertical transistor.

Preferably, the forming-a-barrier-metal-layer-on-lower-sides-of-silicon-pillars-coupled-by-a-bit-line includes forming silicon line patterns in a first direction by etching a semiconductor substrate, forming metal layers each between the silicon line patterns, a first insulating layer on the metal layers, forming the silicon pillars by isotropically etching the silicon line patterns in a second direction to cross the first direction, and forming the barrier metal layers on the lower sides of each of the silicon pillars, thereby completing the bit lines.

Preferably, the forming silicon-line-patterns-in-a-first-direction-by-etching-a-semiconductor-substrate includes forming a mask layer over the semiconductor substrate and patterning the mask layer by performing a photolithography process, forming first patterns by etching the semiconductor substrate using the patterned mask layer, and forming a spacer on sidewalls of each of the first patterns and etching the semiconductor substrate using the patterned mask layer and the spacers as an etch mask.

Preferably, the forming-a-mask-layer-over-the-semiconductor-substrate-and-patterning-the-mask-layer-by-performing-a-photolithography-process includes forming a pad oxide layer on the semiconductor substrate, forming a hard mask layer on the pad oxide layer, coating a photoresist layer on the hard mask layer and patterning the photoresist layer using a photolithography process, etching an exposed hard mask layer using the patterned photoresist layer as an etch mask, and etching the exposed pad oxide layer using the etched hard mask layer.

Preferably, the forming-a-metal-layer-between-the-silicon-line-patterns includes depositing the metal layer between the silicon line patterns, and etching back the metal layer to expose all the spacers.

Preferably, the forming-the-silicon-pillars-by-isotropicly-etching-the-silicon-line-patterns-in-a-second-direction-to-cross-the-first-direction includes forming the mask layer on the first insulating layer and patterning the mask layer having a line form of the second direction crossing the first direction by performing a photolithography process, forming second patterns by etching the first insulating layer and the semiconductor substrate using the patterned mask layer, and forming spacers on sidewalls of each of the second patterns and isotropically etching the semiconductor substrate using the patterned mask layer and the spacers as an etch mask.

Preferably, the forming-the-barrier-metal-layers-on-the-lower-sides-of-each-of-the-silicon-pillars-thereby-completing-the-bit-lines includes depositing a barrier metal layer on an entire surface of a structure, including the silicon pillars, removing an exposed barrier metal layer by etching back the barrier metal layer, sintering the barrier metal layer coming into contact with the semiconductor substrate by performing annealing, etching the semiconductor substrate to a certain depth between the silicon pillars, removing the spacers, and forming an insulating layer between the silicon pillars, including the etched spaces, thereby insulating the metal layer and the barrier metal layer from each other.

Preferably, the forming-gate-electrodes-on-sidewalls-of-each-of-the-silicon-pillars-thereby-completing-a-vertical-transistor includes forming a gate oxide layer to surround the sidewalls of each of the silicon pillars, and forming the gate electrodes to surround the gate oxide layer.

Preferably, the method further comprises forming word lines each connecting the gate electrodes, and forming an insulating layer over the word lines.

Preferably, the forming-word-lines-each-connecting-the-gate-electrodes includes depositing an insulating layer between the gate electrodes, coating a photoresist layer on a structure including the vertical transistors and patterning the photoresist layer by performing a photolithography process using a mask to define regions where the word lines are formed, exposing only upper portions of the gate electrodes by etching the insulating layer using the patterned photoresist layer as an etch mask, and forming a metal layer to connect the exposed upper portions of the gate electrodes.

According to yet another embodiment of the present invention, a method of manufacturing a semiconductor memory device comprises forming silicon line patterns in a first direction by etching a semiconductor substrate, depositing metal layers each between the silicon line patterns, forming a plurality of silicon pillars, connected by the metal layer, by etching the silicon line patterns and the metal layer in a second direction crossing the first direction, and etching lower portions of each of the plurality of silicon pillars and forming a barrier metal layer connecting the metal layers.

Preferably, the barrier metal layer is configured to connect the metal layer in the second direction.

Preferably, the method further comprises forming a gate oxide layer and gate electrodes to surround the silicon pillar, and forming a conductive layer to connect the gate electrodes in the first direction.

Preferably, the etching-lower-portions-of-each-of-the-plurality-of-silicon-pillars-and-forming-a-barrier-metal-layer-connecting-the-metal-layers includes forming concave regions having a gutter form by isotropically etching the respective lower portions of each of the plurality of silicon pillars, depositing the barrier metal layer and removing the exposed barrier metal layer by performing an etchback process, and sintering the barrier metal layer remaining in the concave regions using a silylation process.

Preferably, the etching-lower-portions-of-each-of-the-plurality-of-silicon-pillars-and-forming-a-barrier-metal-layer-connecting-the-metal-layers includes forming concave regions having a cave form by isotropically etching the respective lower portions of each of the plurality of silicon pillars, depositing the barrier metal layer and removing the exposed barrier metal layer by performing a wet etch process, and sintering the barrier metal layer remaining in the concave regions using a silylation process.

DESCRIPTION OF EMBODIMENTS

Embodiment of the present invention will now be described in detail with reference to the accompanying drawings.

FIGS. 1a to 1k are plan views and cross-sectional views showing a method of manufacturing a semiconductor device including vertical transistors according to an embodiment of the present invention. In particular, an example in which a vertical transistor is used as a cell transistor included in each of unit cells within a semiconductor memory device is described.

Figure 1A:
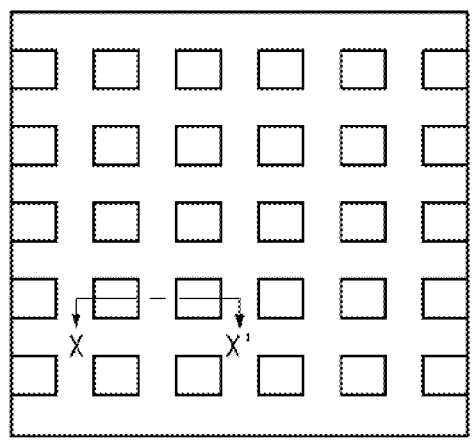
FIGS. 1a to 1k are plan views and cross-sectional views showing a method of manufacturing a semiconductor device including vertical transistors according to an embodiment of the present invention.
Figure 1B:
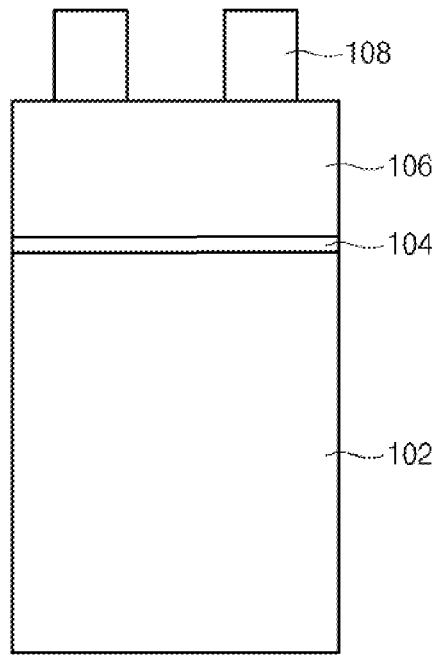

FIG. 1a is a plan view showing a cell array region within the semiconductor device, and FIG. 1b is a cross-sectional view of the semiconductor device taken along line X-X' in FIG. 1a.

A pad oxide layer 104 is formed on a semiconductor substrate 102. A hard mask nitride layer 106 is formed on the pad oxide layer 104. A photoresist layer is coated on the hard mask nitride layer 106, and a photolithography process using a mask is then performed, thereby forming a first photoresist layer pattern 108. In the case where a vertical transistor is used as the cell transistor of a unit cell, a plurality of the vertical transistors is formed so that they are arranged in rows and columns as shown in FIG. 1a. A method of manufacturing the vertical transistors is described below using cross sections taken along X-X' at different steps of the process.

Figure 1C:
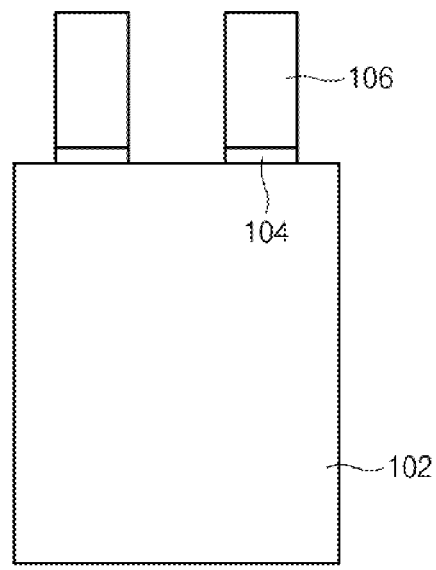

Referring to FIG. 1c, the hard mask nitride layer 106 and the pad oxide layer 104 are sequentially etched using the first photoresist layer pattern 108 as an etch mask. The remaining photoresist layer pattern 108 is removed.

Figure 1D:
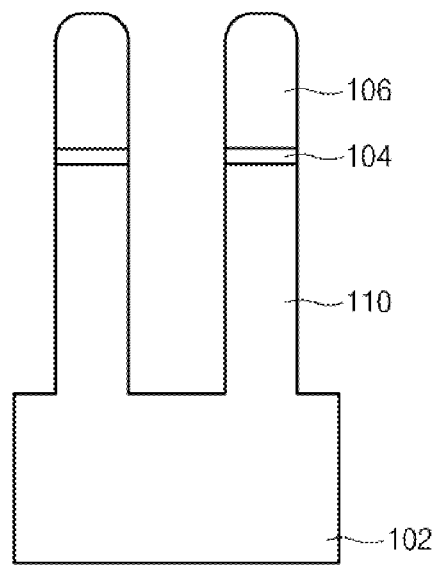

Referring to FIG. 1d, the exposed semiconductor substrate 102 is etched using the partially etched hard mask nitride layer 106 as an etch mask, thereby forming silicon pillars 110 in which channel regions of the vertical transistors will be formed.

Figure 1E:
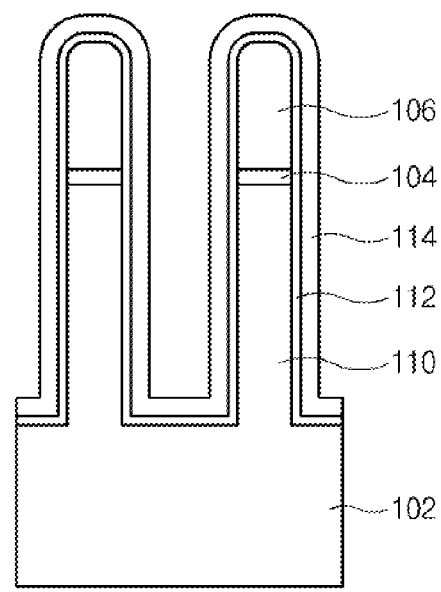

Referring to FIG. 1e, a gate oxide layer 112 is formed on the exposed surface of the semiconductor substrate 102, including the sides of the silicon pillars 110. A conductive material 114 for a gate electrode is deposited on the entire surface of the structure, including the silicon pillars 110, and over the semiconductor substrate 102.

Figure 1F:
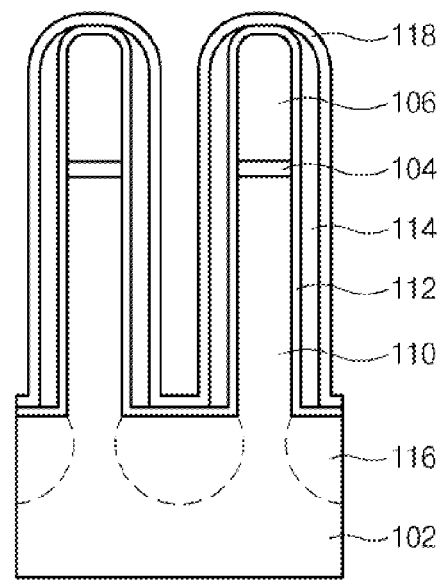

Referring to FIG. 1f, the conductive material 114 for a gate electrode, formed between the silicon pillars 110 and over the semiconductor substrate 102, is removed. The conductive material 114 on each side of the silicon pillars is separated from each other. Ion implantation for the semiconductor substrate 102 is performed to form bit line regions 116. After the bit line regions 116 are formed, a nitride layer 118 is formed on the entire surface of the structure.

Figure 1G:
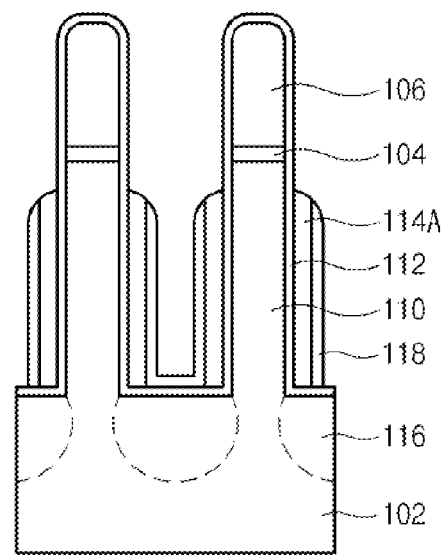

Referring to FIG. 1g, a first dielectric interlayer (not shown) is deposited between the silicon pillars 110. A polishing process is carried out until the gate oxide layer 112 is exposed. The first dielectric interlayer, the nitride layer 118, and the conductive material 114 for a gate electrode are removed by performing an etchback process until part of the gate oxide layer 112 formed on the silicon pillars 110 is exposed. Through this process, a channel region, source/drain regions, and a gate electrode 114A of a transistor is defined within each of the silicon pillars 110.

Figure 1H:
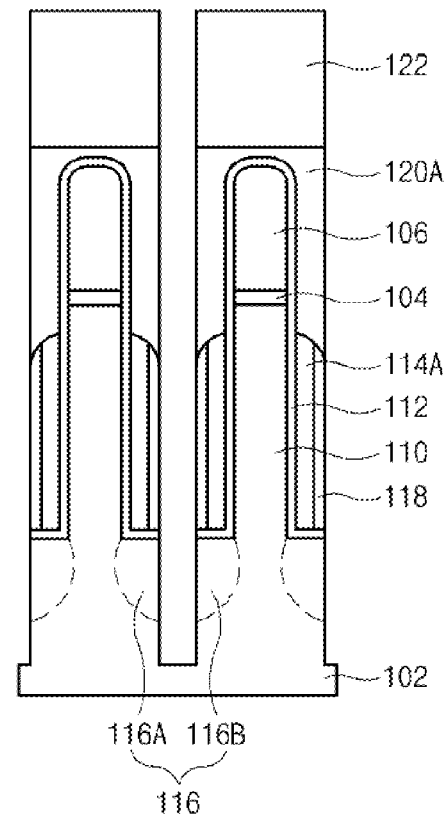

Referring to FIG. 1h, a second dielectric interlayer 120A is further deposited in such a way as to cover the silicon pillars 110 and the hard mask nitride layer 106, and a polishing process is then performed. A photoresist layer is coated on the polished first dielectric interlayer 120A. Next, a second photoresist layer pattern 122 is formed by performing a photolithography process using a bit line mask. The first photoresist layer pattern 108 shown in FIG. 1b is used to define the positions of the silicon pillars 110 for forming the vertical transistors, and the second photoresist layer pattern 122 shown in FIG. 1h is used to define the positions of bit lines 116A and 116B.

The exposed first and second dielectric interlayers and 120A are removed using the second photoresist layer pattern 122 as an etch mask. The gate oxide layer 112 exposed between the silicon pillars 110 is etched. The bit line region 116 and the semiconductor substrate 102, exposed between the silicon pillars 110 through the removal of the gate oxide layer 112, are etched, thereby forming bit lines 116A and 116B.

Figure 1I:
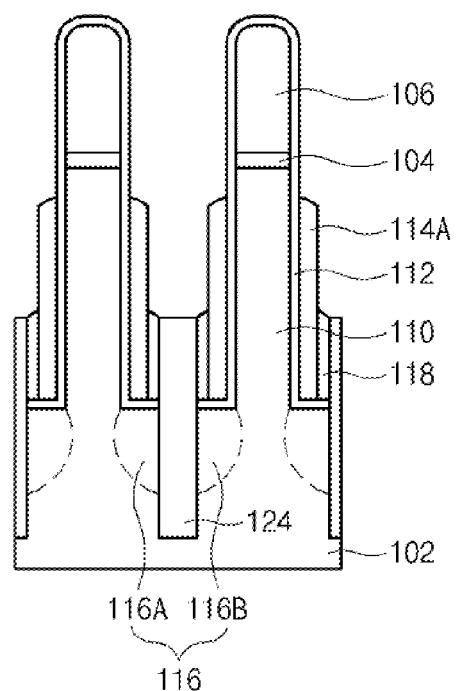

Referring to FIG. 1i, the second photoresist layer pattern 122 and the second dielectric interlayer 120A, remaining after formation of the bit lines 116A and 116B, are removed. A third dielectric interlayer 124 is deposited between the neighboring bit lines 116A and 116B and then polished.

A photoresist layer (not shown) is coated on the third dielectric interlayer 124. A photolithography process using a mask for defining word lines is carried out, and the photoresist layer is then patterned. The third dielectric interlayer 124 exposed by the patterned photoresist layer and the nitride layer 118 formed outside the gate electrode 114A are etched. The third dielectric interlayer 124 is formed in order to electrically fully insulate the neighboring bit lines 116A and 116B and also reduce capacitance between the bit lines 116A and 116B and word lines. Accordingly, the third dielectric interlayer 124 may preferably remain at a certain height over the bottoms of the neighboring two silicon pillars 110, rather than being formed solely within trenches of the semiconductor substrate 102.

Figure 1J:
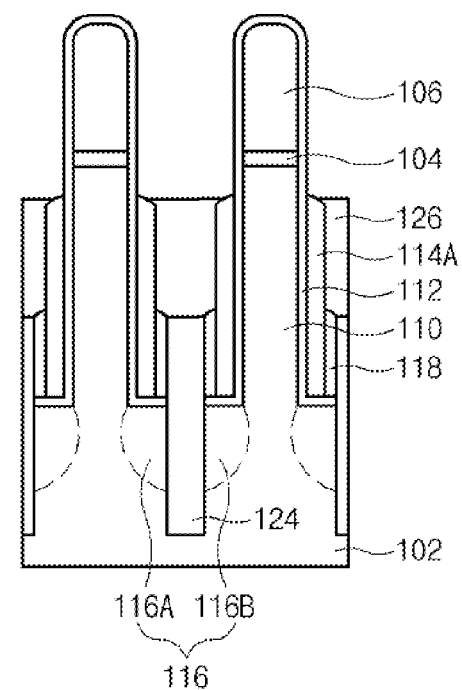

Referring to FIG. 1j, a conductive material is filled in a space formed by the etching of the third dielectric interlayer 124. An etchback process is performed until the gate electrode 114A is exposed, thereby forming word lines 126.

Figure 1K:
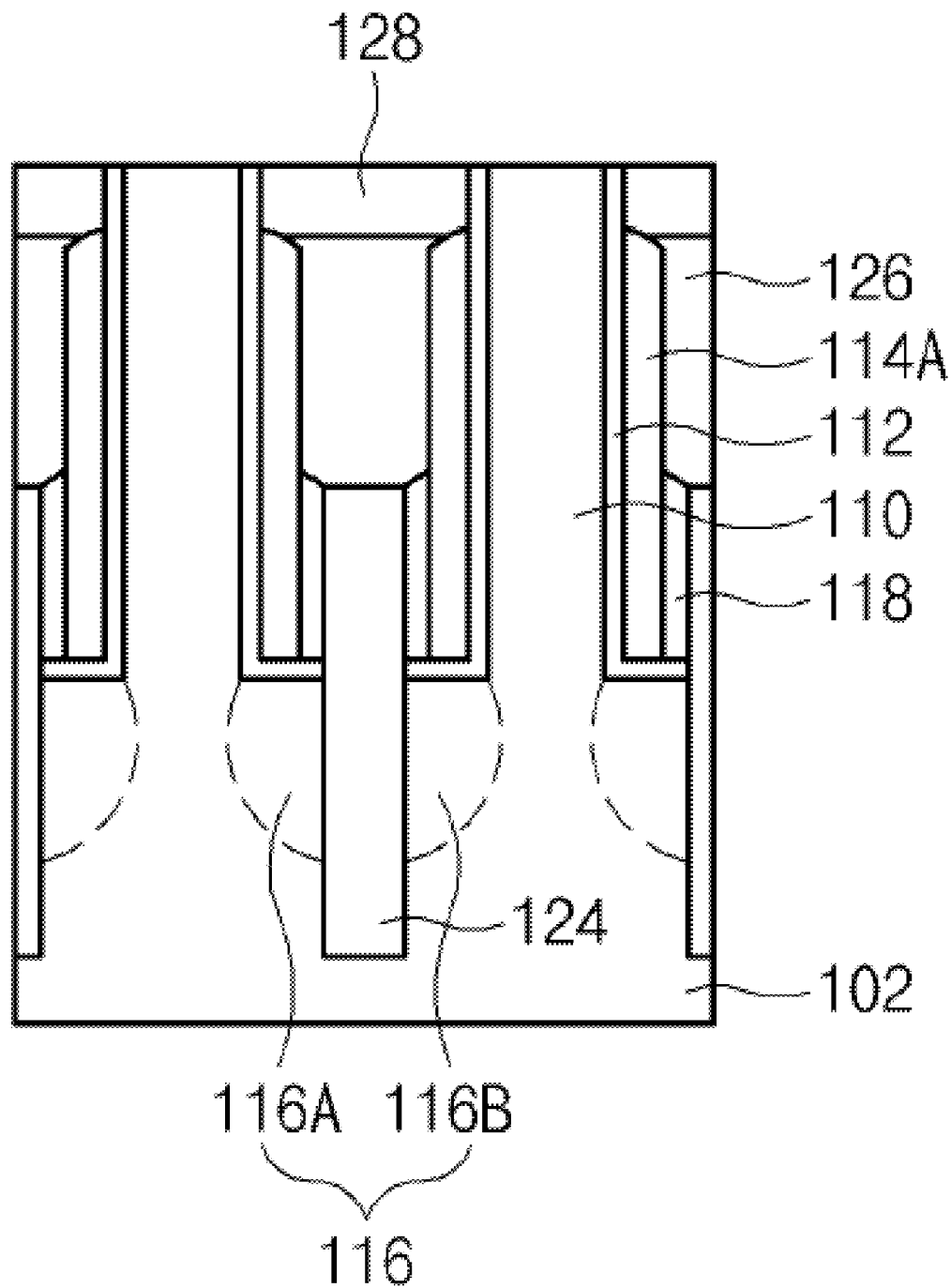

Referring to FIG. 1k, after the word lines 126 are formed, a fourth dielectric interlayer 128 is deposited. The hard mask nitride layer 106 and the pad oxide layer 104 are removed by performing a polishing process until the top surfaces of the silicon pillars 110 are exposed. The top surface of the silicon pillar 110 exposed by the polishing process become the storage node of the unit cell.

As described above, when unit cells including vertical transistors are formed, silicon pillars (i.e., the channel regions of the vertical transistors) are formed and ion implantation is then carried out in order to form bit lines. A doped region is formed at the bottom of the silicon pillars through ion implantation, thereby forming bit line regions. The exposed bit line regions between silicon pillars are removed using a photoresist layer pattern as an etch mask, thereby separating the bit lines from each other.

In this process, however, resistance is high when data or a signal is transmitted because the bit lines are formed by an ion implantation process. Accordingly, the operating current of the vertical transistor is low and the amount of current transferred through the bit lines is reduced.

Further, after the bit line region is formed between the neighboring vertical transistors, part of the bit line region is etched using the photoresist layer pattern as an etch mask to separate the bit line regions. However, if an alignment error occurs in the process of forming the photoresist layer pattern used as the etch mask, a semiconductor device may be defective if the bit line regions are not separated from each other. In particular, for a cell array of a high-integrated semiconductor memory device (i.e., a very narrow distance between neighboring silicon pillars with the silicon pillars having a very small size) a process margin for forming the photoresist layer pattern for separating the bit line regions is very small. Accordingly, there is a possibility that the production yield may be low because of alignment error.

Another embodiment of the present invention is described in detail below with reference to the accompanying drawings.

Unlike the embodiment in which the bit lines are formed under the silicon pillars through ion implantation, in the present embodiment, the bit lines are formed of a metal layer in order to lower the resistance of the bit lines.

In more detail, after the silicon pillars are formed by etching the semiconductor substrate in a horizontal direction and a vertical direction, the semiconductor substrate is further etched in one of the horizontal and vertical directions, and a metal layer is formed in the etched spaces. During the etching of the substrate in either the horizontal or vertical direction, certain parts of the metal layer can be removed to isolate a row or column of silicon pillars from each other. Accordingly, the plurality of silicon pillars can be connected in either the horizontal direction or the vertical direction through the metal layer.

If the bit lines are formed of the metal layer using this method as described above, photoresist layers and masking processes are not required to create the bit lines. Accordingly, the present embodiment can reduce alignment error when photolithography processes are performed several times using masks in which different patterns are defined.

Figure 2A:
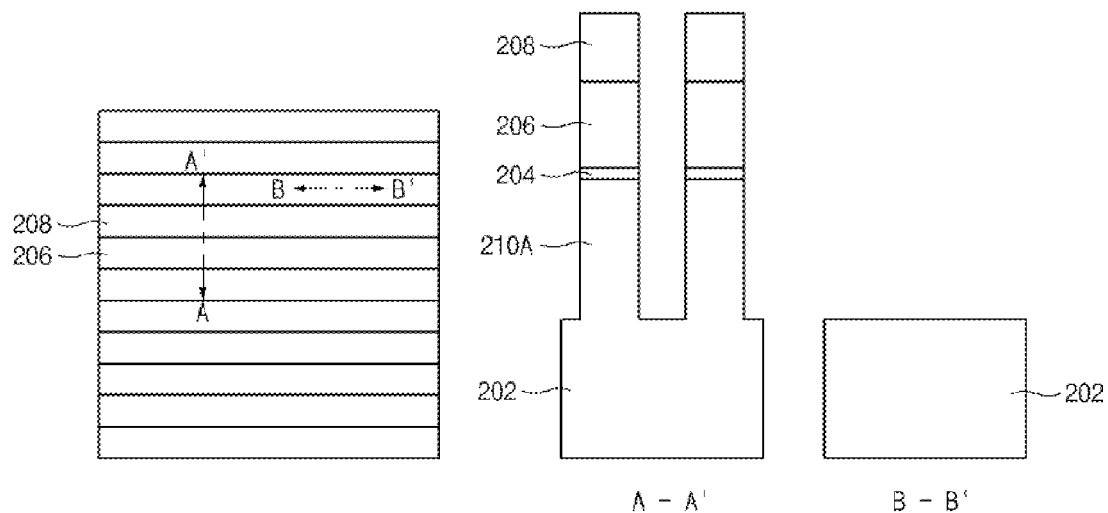
FIGS. 2a to 2q are plan views and cross-sectional views showing a method of manufacturing a semiconductor device including vertical transistors according to another embodiment of the present invention.
Figure 2B:
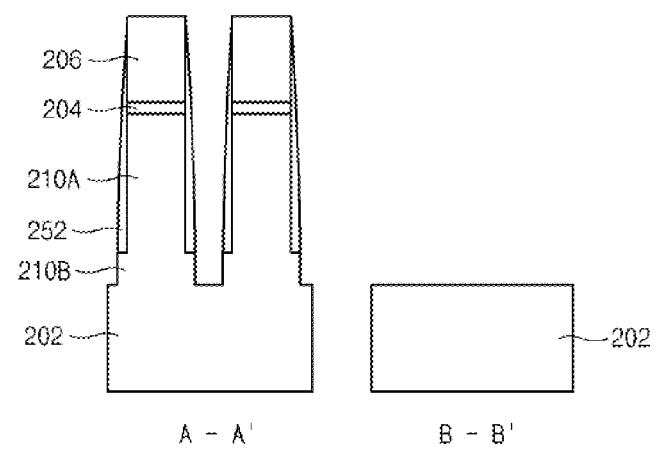
Figure 2C:
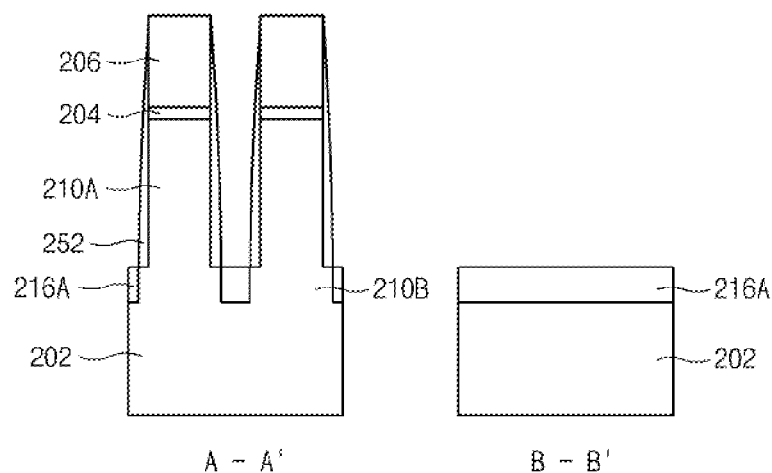
Figure 2D:
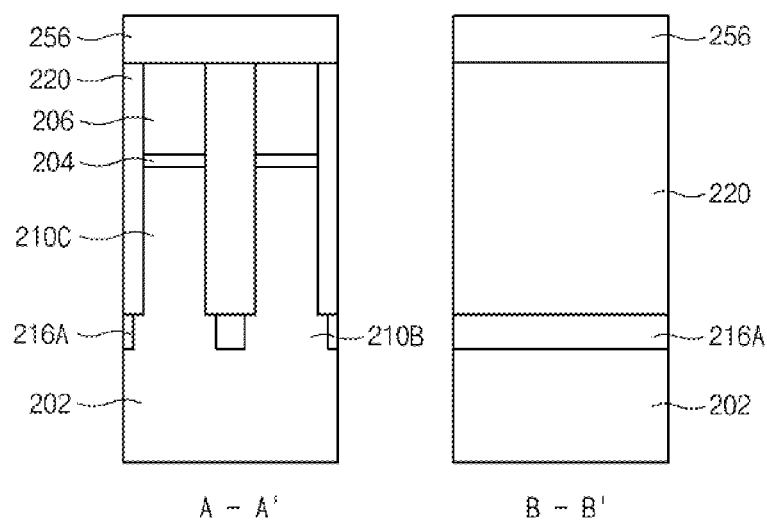
Figure 2E:
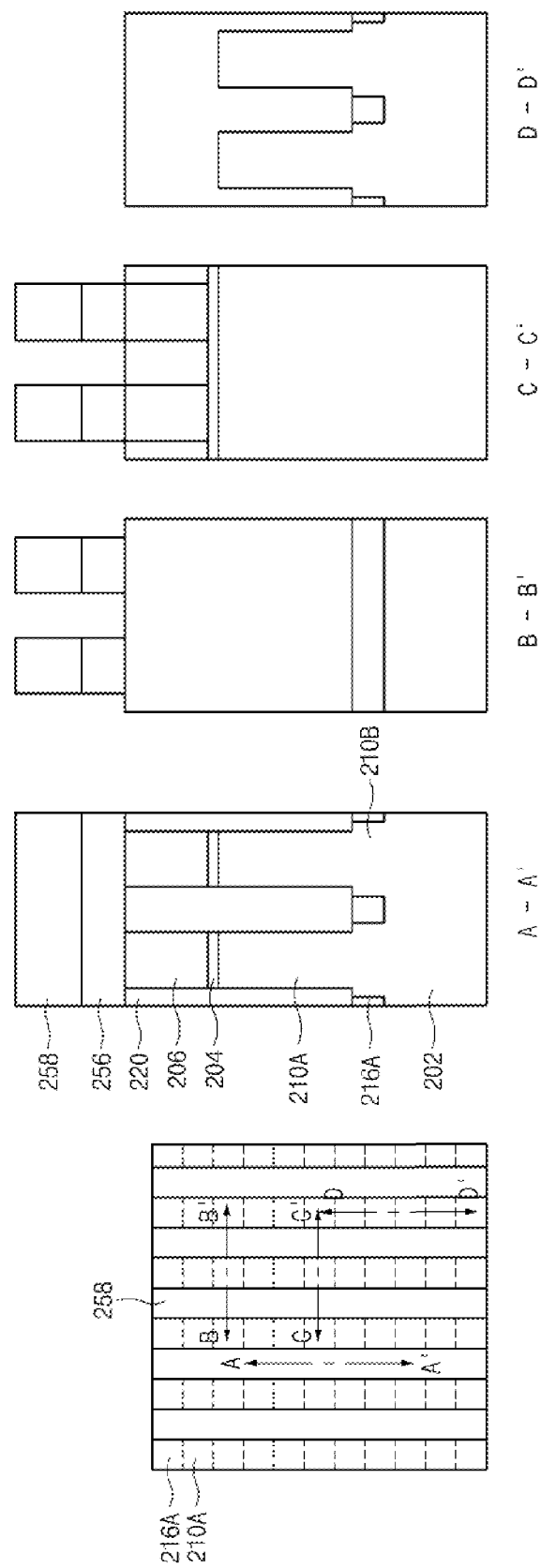
Figure 2F:
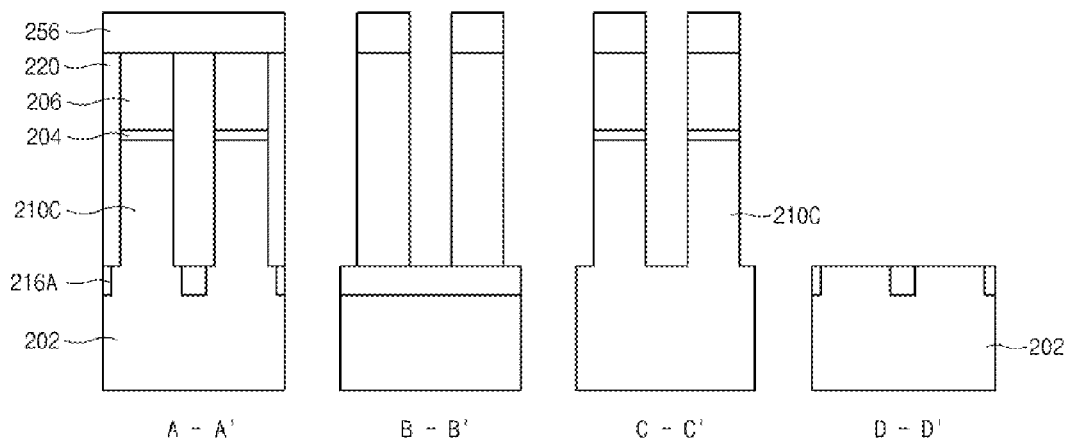
Figure 2G:
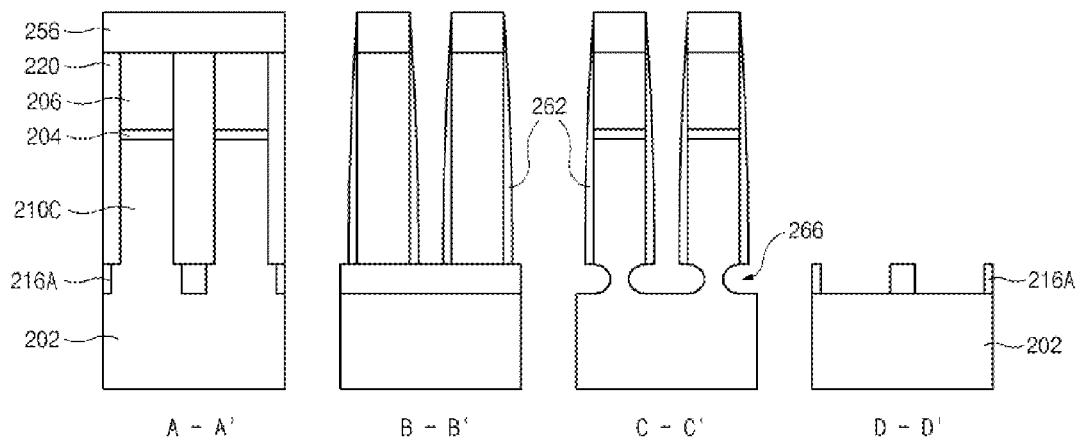
Figure 2H:
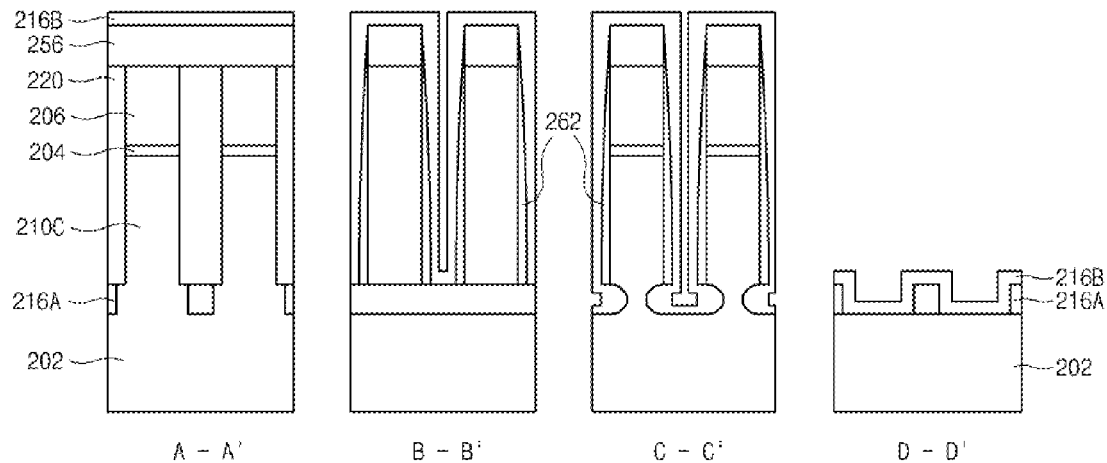
Figure 2I:
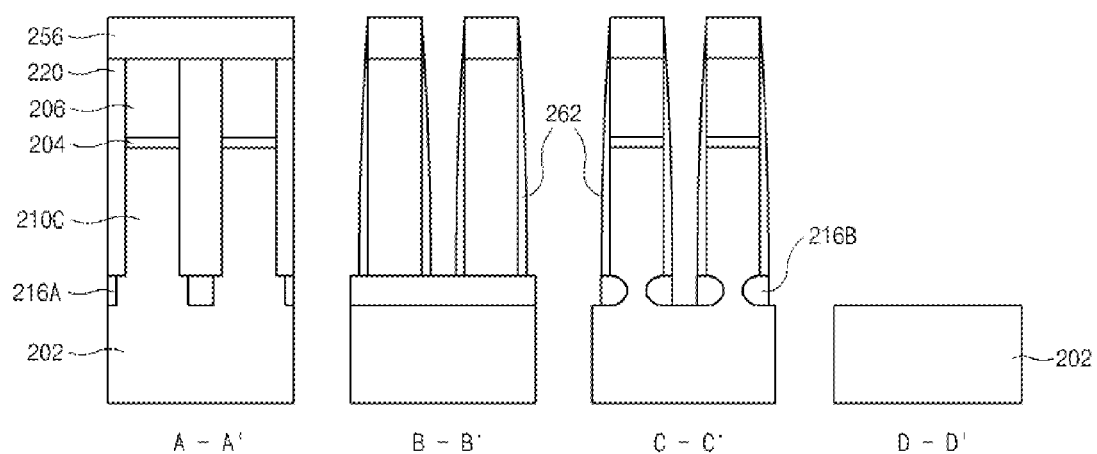
Figure 2J:
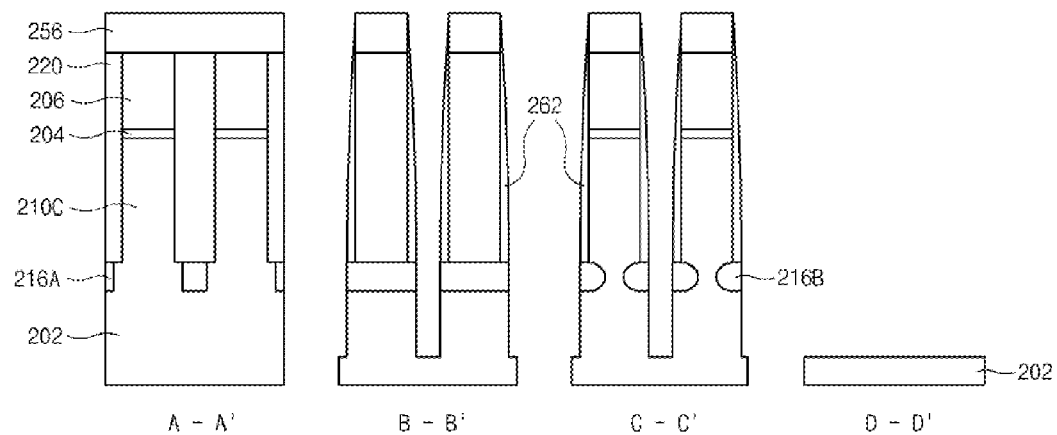
Figure 2K:
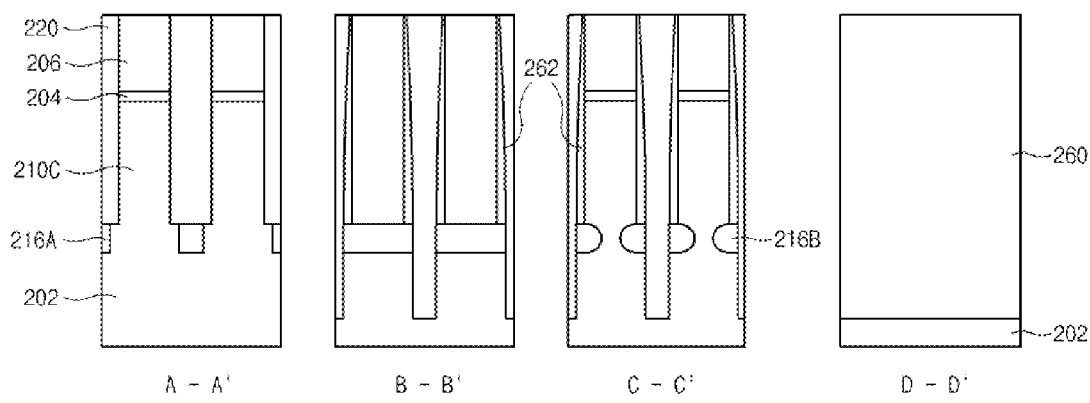
Figure 21:
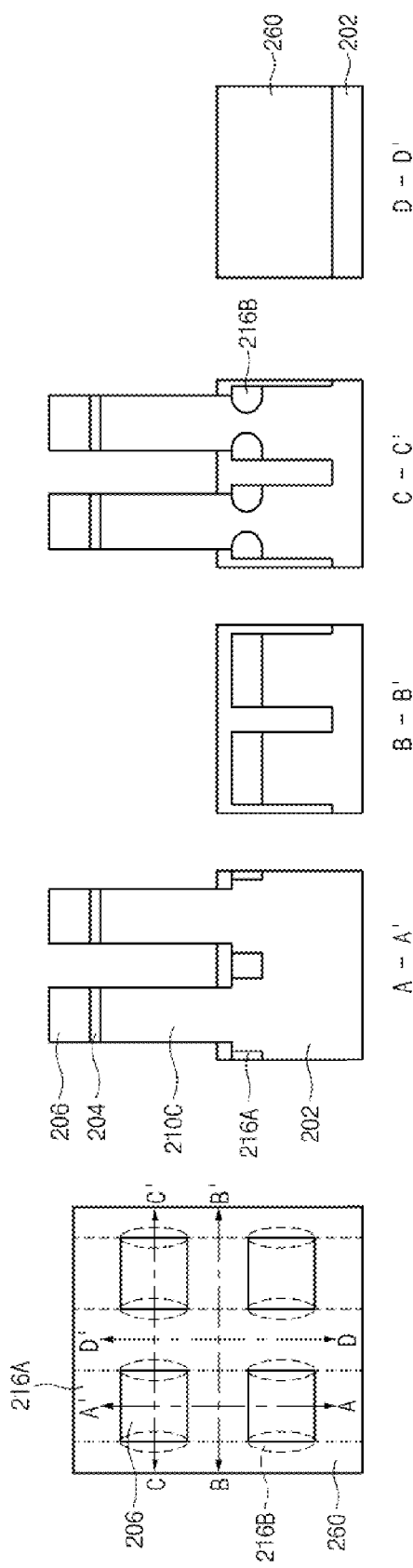
Figure 2M:
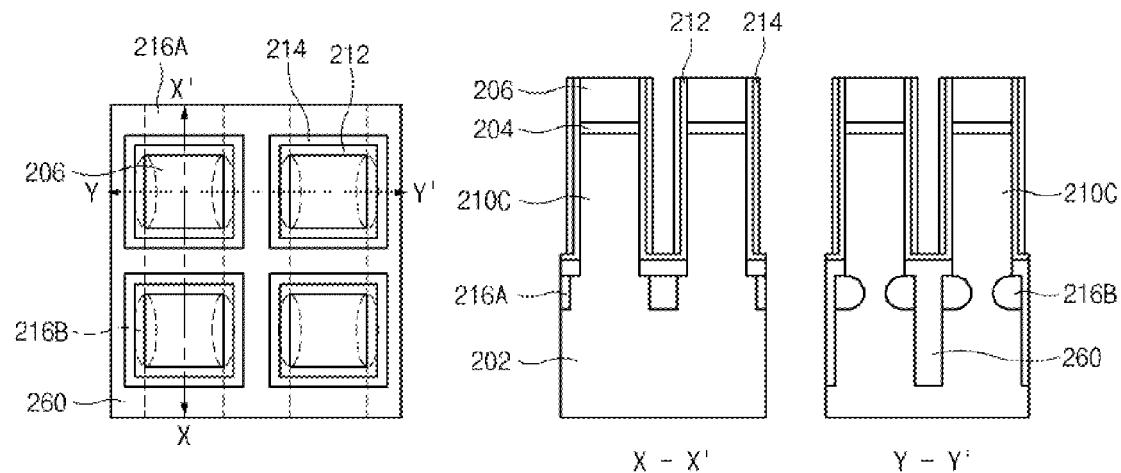
Figure 2N:
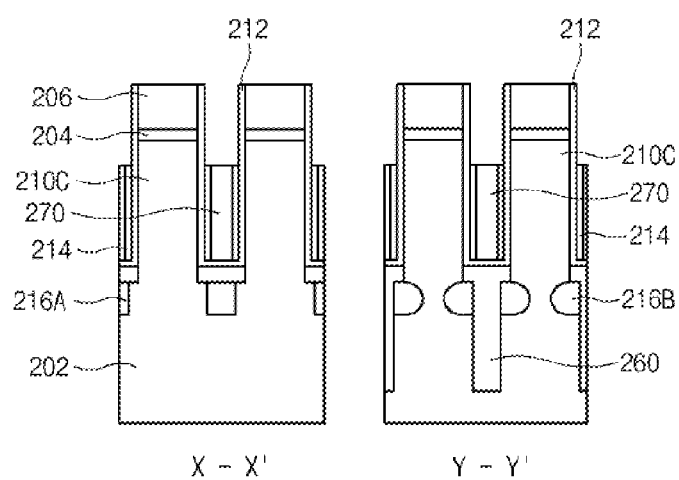
Figure 2O:
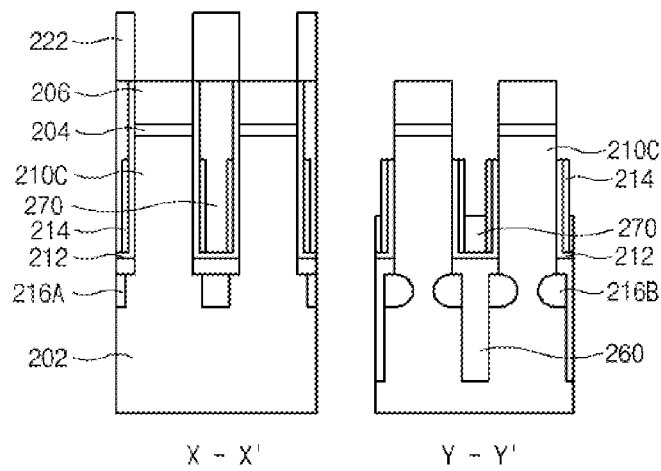
Figure 2P:
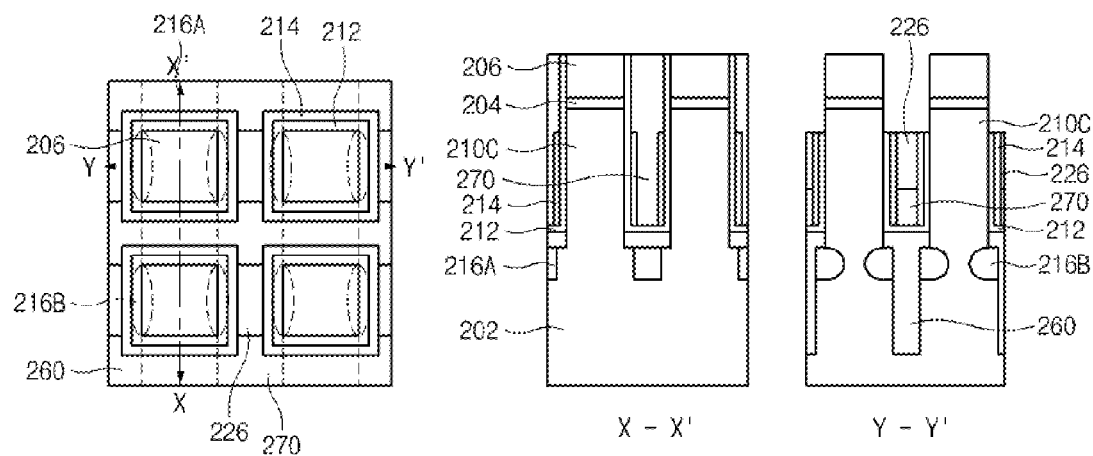
Figure 2Q:
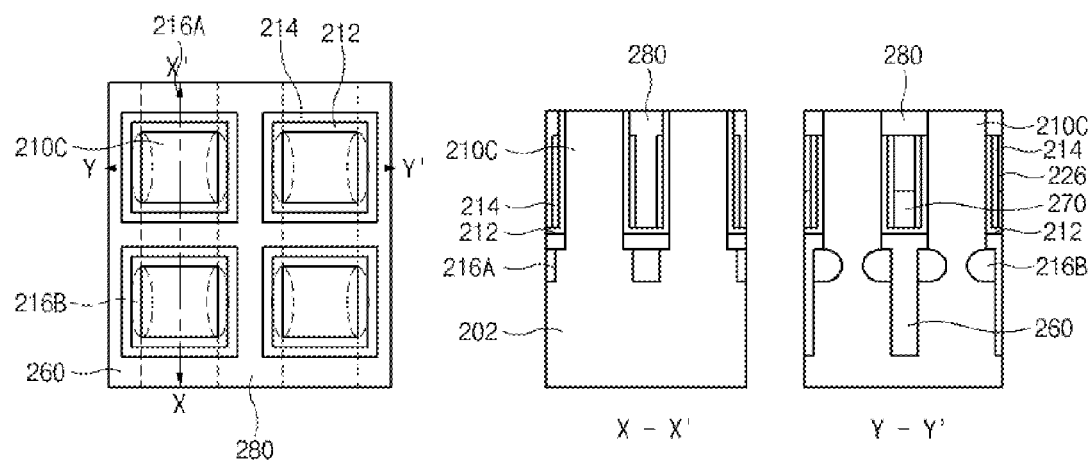

FIGS. 2a to 2q are plan views and cross-sectional views showing a method of manufacturing a semiconductor device including vertical transistors according to another embodiment of the present invention.

FIG. 2a is a plan view showing a first photoresist layer pattern 208 formed over a semiconductor substrate 202 and cross-sectional views showing a process of etching the semiconductor substrate 202 using the first photoresist layer pattern 208 as an etch mask. In particular, the cross sections are taken along line A-A' and B-B' in the plan view.

A pad oxide layer 204 is formed on the semiconductor substrate 202. A first hard mask layer 206, e.g., a nitride layer, is deposited on the pad oxide layer 204. The first photoresist layer pattern 208 is formed on the first hard mask layer 206. The first hard mask layer 206, the pad oxide layer 204, and the semiconductor substrate 202 exposed between the first photoresist layer patterns 208 are sequentially etched. With respect to the plan view of FIG. 2a, the first photoresist layer patterns 208 are formed in a horizontal direction. First patterns 210A having a line form are formed by etching the semiconductor substrate 202 using the first photoresist layer patterns 208 as an etching mask.

Referring to FIG. 2b, after the first photoresist layer patterns 208 are removed, a first spacer layer 252, e.g., an oxide layer, is formed on the sidewalls of the first patterns 210A and the first hard mask layers 206. After depositing the first spacer layer 252, an etchback process is carried out so that the first spacer layer 252 remains on the sidewalls of the first patterns 210A and the first hard mask layers 206. Next, second patterns 210B are formed by etching the semiconductor substrate 202 to a certain depth using the first spacer oxide layer 252 as an etch mask.

Referring to FIG. 2c, a metal layer 216A is formed between the second patterns 210B. After depositing the metal layer 216A on the semiconductor substrate 202 and between the second patterns 210B, an etchback process is carried out so that the first spacer layer 252 is exposed. The metal layer 216A is used as a bit line which connects, in one direction, the lower portions (e.g., transistor drains) of neighboring silicon pillars to be formed later.

Referring to FIG. 2d, after forming the metal layer 216A, the first spacer layer 252 is removed. Next, a first dielectric interlayer 220 is deposited on the metal layer 216A and is then polished using Chemical Mechanical Polishing (CMP) so that the first hard mask layer 206 is exposed. Next, a second hard mask layer 256 is formed on the first hard mask layer 206 and the first dielectric interlayer 220.

Referring to FIG. 2e, second photoresist layer patterns 258 are formed in a vertical direction crossing the direction where the first hard mask layer 206 and the first patterns 210A having a line form are formed. Hereinafter, subsequent processes are described with reference to the cross section taken along line A-A', B-B', C-C', and D-D' in the plan view of FIG. 2e.

The second hard mask layer 256 is patterned using the second photoresist layer patterns 258 as an etch mask. After the second hard mask layer 256 is patterned, the remaining second photoresist layer patterns 258 are removed.

Referring to FIG. 2f, silicon pillars 210C are formed by etching the first dielectric interlayer 220, the first hard mask layer 206, the pad oxide layer 204, and the first patterns 210A, using the patterned second hard mask layer 256 as an etch mask. The process of etching the first dielectric interlayer 220 and the first patterns 210A is carried out until a top surface of the metal layer 216A is exposed.

Referring to FIG. 2g, a second spacer layer 262 is formed on the sidewalls of the resulting structure, including the silicon pillars 210C and the first dielectric interlayer 220. The second spacer layer 262 may be formed by depositing an oxide layer and then performing an etchback process in a similar way to the first spacer layer 252. Gutters 266 are formed by isotropically etching the exposed second patterns 210B using the second spacer layer 262 and the second hard mask layer 256 as an etch mask. Here, since the exposed second patterns 210B are isotropically etched, the gutters 266 each having a round concave form is formed at the bottoms of the silicon pillars 210C. This includes etching a portion of the semiconductor substrate 202 underneath the silicon pillars 210C. The above isotropic etch process differs from the anisotropic etch process used in forming the first and second patterns 210A and 210B shown in FIGS. 2a and 2b.

Referring to FIG. 2h, a barrier metal layer 216B is deposited on the entire surface of the structure, including the silicon pillars 210C, the first dielectric interlayer 220, and the second hard mask layer 256. The barrier metal layer 216B is formed to fill the gutters 266 formed at the bottom of the silicon pillars 210C.

Referring to FIG. 2i, the exposed barrier metal layer 216B (as seen from directly above) and the exposed metal layer 216A are removed by performing an etchback process. The barrier metal layer 216B and the metal layer 216A, in contact with silicon, are sintered by performing an annealing process, thereby completing the bit lines. Consequently, the metal layer 216A connecting the plurality of silicon pillars 210C remains under the second photoresist layer pattern 258 formed in the vertical direction (as seen from the plan view), but is removed from the remaining regions.

Further, the regions of the barrier metal layer 216B, formed to fill the gutters 266 and exposed between the silicon pillars 210C, are also removed. In another embodiment of the present invention, the process of removing the exposed barrier metal layer 216B and the exposed metal layer 216A can be carried out with a wet etch process.

According to the above process of the present embodiment, source/drain regions of the vertical transistor, connecting the bit lines formed between the silicon pillars 210C, may be formed under the silicon pillars 210C. Accordingly, the degree of integration of semiconductor devices can be increased, by allowing the pillars to be spaced closer together. Also, the resistance value of the bit lines can be reduced by using a metal layer rather than forming the bit lines through an ion implantation process. Furthermore, in the present embodiment, since the barrier metal layer 216B used to fill the gutters 266 of the semiconductor substrate 202 is sintered using an annealing process, the silicon pillars 210C are less likely to collapse although they have a high aspect ratio.

Referring to FIG. 2j, the semiconductor substrate 202 exposed between neighboring silicon pillars 210C is etched to a certain depth using the second hard mask layer 256 and the second spacer layer 262, formed in the vertical direction where the plurality of silicon pillars 210C are coupled to each other, as an etch mask. Accordingly, the neighboring bit lines are fully isolated. Next, the remaining second hard mask layer 256 and the remaining second spacer layer 262 are removed.

Referring to FIG. 2k, a second dielectric interlayer 260 is deposited over the semiconductor substrate 202. A polishing process is then carried out until the surface of the first hard mask layer 206 is exposed.

Referring to the cross section of FIG. 2l, the second dielectric interlayer 260 is etched to a certain depth by performing an etchback process using the first hard mask layer 206 as an etch barrier. The second dielectric interlayer 260 remains to a certain depth on the metal layer 216A formed between the silicon pillars 210C. From the plan view of FIG. 2l, the positions of the silicon pillars 210C formed under the first hard mask layer 206, the positions of the barrier metal layers 216B formed on the lower sides of the silicon pillars 210C, and the positions of the metal layers 216A each connecting the bottoms of the silicon pillars 210C can be seen.

Referring to FIG. 2m, a gate oxide layer 212 is formed on the silicon pillars 210C and the second dielectric interlayer 260. A conductive material is deposited in order to form a gate electrode 214 between the silicon pillars 210C. An etchback process is then carried out so that the gate electrode 214 is formed on the sidewalls of each of the silicon pillars 210C. The gate electrodes 214 are separated from each other so that they are not connected between neighboring silicon pillars 210C. Consequently, the sidewalls of each of the silicon pillars 210C is surrounded by the gate oxide layer 212 and the gate electrode 214.

Referring to FIG. 2n, a third dielectric interlayer 270 is deposited between the gate electrodes 214. A polishing process is carried out until the top surface of the first hard mask layer 206 is exposed. Next, the third dielectric interlayer 270 is removed to a certain depth by performing an etchback process. Here, the third dielectric interlayer 270 is removed so that it is lower than the top surface of the silicon pillars 210C. After part of the third dielectric interlayer 270 is removed, the gate electrodes 214 exposed on the sidewalls of the silicon pillars 210C are removed, and so the gate electrodes 214 and the third dielectric interlayers 270 are lower in height than the silicon pillars 210C.

Referring to FIG. 2o, a photoresist layer is coated on the first hard mask layers 206 and the third dielectric interlayers 270. Third photoresist layer patterns 222 expose regions where word lines will be formed. The third photoresist layer patterns 222 are formed to have a line pattern of a horizontal direction similar to the pattern of the first photoresist layer patterns 208 used to form the silicon pillars 210C. Further, the third photoresist layer patterns 222 also function to prevent the third dielectric interlayer 270 from being removed. Accordingly, the positions of the third photoresist layer patterns 222 differ from those of the first photoresist layer patterns 208.

The gate oxide layer 212 exposed between the gate electrodes 214 is removed using the third photoresist layer patterns 222 as an etch mask. Part of the exposed third dielectric interlayer 270 is also removed. Here, for the purpose of electrical insulation between the word lines and the bit lines formed on the lower sides of the silicon pillars 210C, the third dielectric interlayer 270 partially remains on the gate oxide layer 212. The third photoresist layer patterns 222 remaining after the etching of the third dielectric interlayer 270 are removed.

Referring to FIG. 2p, a conductive material is deposited on the gate electrodes 214 exposed through the etching of the third dielectric interlayer 270, and word lines 226 are formed by performing an etchback process.

Referring to FIG. 2q, after the word lines 226 are formed, a fourth dielectric interlayer 280 is formed on the word lines 226. Next, a polishing process is carried out so that the first hard mask layer 206 over the silicon pillars 210C is removed, thereby exposing the top surfaces of the silicon pillars 210C. The top surface of each of the silicon pillars 210C corresponds to a where a storage node (e.g., capacitor for a memory device) would be formed in subsequent processes.

As described above, in the semiconductor memory device according to the embodiment of the present invention, a unit cell includes a plurality of vertical transistors in each of which conduction regions corresponding to source/drain regions are included on the upper and lower portions of a pillar shape, and the vertical transistors of the unit cells are connected by bit lines including the metal layer having a low resistance value.

In the present invention, in the process of forming the silicon pillars using the photoresist layer patterns of a line form which are arranged in opposite directions in order to form the vertical transistors, the bit lines of a line form are formed on the lower sides of the silicon pillars. Accordingly, power consumption of a semiconductor memory device can be reduced and operational stability in a low power environment can be guaranteed because the bit lines can be formed of the metal layer, etc. having a low resistance as compared with an implementation where bit lines that are formed through ion implantation. In particular, the operation of peripheral circuits of a unit cell, such as a sense amp, can be facilitated because the amount of current corresponding to data transferred from a cell array within a semiconductor memory device can be increased.

Furthermore, in the process of forming the bit lines, photoresist layer patterns other than the photoresist layer patterns for forming the silicon pillars are not required. Accordingly, alignment error between micro patterns, easily occurring in a process of forming unit cells within a high-integrated semiconductor memory device, can be reduced greatly. It leads to an improved operating characteristic and increased yield of a semiconductor memory device including the vertical transistors.

According to the present invention, the pattern process of forming the silicon pillars including the channel regions of the vertical transistors is performed twice in opposite directions, and the conductive material is formed in the bit line regions between the twice pattern processes. Accordingly, there is an advantage in that the operating current within a semiconductor device can be increased because the bit lines of the present invention may have a low resistance value as compared with the conventional bit lines formed through ion implantation. Moreover, since the operating current within a semiconductor device can be increased, the operating speed of the semiconductor device can be enhanced or the level of a supply voltage can be lowered, so power consumption of the semiconductor device can be reduced.

Further, according to the present invention, the bit lines are patterned when the pattern process of forming the silicon pillars is performed. Accordingly, alignment error can be prevented because it is not necessary to perform a photolithography process of separating the bit lines between the silicon pillars from each other in the known art, and so the production yield can be improved.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method for manufacturing a semiconductor device, comprising:
    etching a semiconductor substrate in a first direction to form a silicon line pattern;
    depositing a first metal layer in a space defined by the silicon line pattern;
    forming a plurality of pillars by etching the silicon line patterns and the first metal layer in a second direction crossing the first direction, the pillars being connected by the first metal layer;
    etching a lower portion of each pillar; and
    forming a second metal layer in the etched lower portion of each pillar, the second metal layer contacting the first metal layer.

2. The method according to claim 1, wherein the second metal layer is configured to connect the first metal layer in the second direction.

3. The method according to claim 1, further comprising:
    forming a gate oxide layer and a gate electrode around each pillar; and
    forming a conductive layer to connect the gate electrode of each pillar in the first direction.

4. The method according to claim 1, wherein etching the lower portion of each pillar involves forming concave regions by isotropically etching the lower portion of each pillar, the method further comprising:
    removing part of the second metal layer by performing an etchback process, the second metal layer remaining in the concave regions; and
    sintering the second metal layer remaining in the concave regions using a silylation process.

5. The method according to claim 1, wherein etching the lower portion of each pillar involves forming concave regions by isotropically etching the lower portion of each pillar, the method further comprising:
    removing part of the second metal layer by performing a wet etch process, the second metal layer remaining in the concave regions; and
    sintering the second metal layer remaining in the concave regions using a silylation process.

* * * * *